United States Patent [19]

Geissler et al.

[11] Patent Number: 5,434,109
[45] Date of Patent: Jul. 18, 1995

[54] OXIDATION OF SILICON NITRIDE IN SEMICONDUCTOR DEVICES

[75] Inventors: Stephen F. Geissler, Underhill; Josef W. Korejwa, Shelburne; Jerome B. Lasky, Essex Junction, all of Vt.; Pai-Hung Pan, Hopewell Junction, N.Y.

[73] Assignee: International Business Machines Corporation, Armonk, N.Y.

[21] Appl. No.: 54,112

[22] Filed: Apr. 27, 1993

[51] Int. Cl.⁶ .............................. H01L 21/02
[52] U.S. Cl. ........................ 437/239; 437/238; 437/52; 437/920; 437/978; 437/241
[58] Field of Search ............... 437/238, 241, 243, 920, 437/978, 52

[56] References Cited

U.S. PATENT DOCUMENTS

| | | | |
|---|---|---|---|
| 4,748,131 | 5/1988 | Zietlow | 437/24 |
| 4,801,988 | 1/1989 | Kenney | 357/23.6 |
| 4,833,094 | 5/1989 | Kenney | 437/52 |
| 4,894,352 | 1/1990 | Lane et al. | 437/238 |
| 4,960,581 | 10/1990 | Harada et al. | 423/489 |
| 5,043,224 | 8/1991 | Jaccodine et al. | 428/446 |

OTHER PUBLICATIONS

Cable et. al., "Improvements in Rapid Thermal Oxide/Re-oxidized Nitrided Oxide (ONO) Films Using NF₃"; Mat. Res. Soc. Symp. Proc. vol. 224, pp. 403–408; 1991.

Kouvatsos et al., "Silicon-fluorine bonding and fluorine profiling in SiO₂ films grown by NF₃-enhanced oxidation", Appl. Phys. Lett. 61 (7), pp. 780–782, Aug. 17, 1992.

*Primary Examiner*—Brian E. Hearn
*Assistant Examiner*—Trung Dang
*Attorney, Agent, or Firm*—Heslin & Rothenberg

[57] ABSTRACT

A silicon nitride layer in a semiconductor device is oxidized by exposure to a mixture of an oxygen reactant and a dilute amount of a fluorine-containing compound at a temperature sufficiently high to substantially cause the oxidation of the silicon nitride. Generally, a temperature greater than about 600° C. is sufficient to cause such oxidation, although some oxidation may occur at lower temperatures. The concentration of the fluorine-containing compound is also not critical, but is generally between about 100 to 1500 ppm by volume relative to the total mixture volume. Preferably, NF₃ is the fluorine-containing compound, and a temperature greater than about 700° C. at a concentration of between about 100 to 1000 ppm is used.

17 Claims, 3 Drawing Sheets

OXIDATION OF SILICON NITRIDE IN SEMICONDUCTOR DEVICES

FIELD OF THE INVENTION

The present invention relates generally to semiconductor devices and, in particular, to a method for oxidizing silicon nitride in semiconductor devices using an oxidizing ambient with a dilute amount of a fluorine-containing compound.

DESCRIPTION OF THE PRIOR ART

Silicon nitride is commonly used in the manufacture of semiconductor devices. One such use for silicon nitride is as an insulation stack commonly known as an ONO layer (i.e. a silicon oxide-silicon nitride-silicon oxide layer) which may be used, for example, as a gate insulator or as an insulator for a deep-trench memory storage device. One disadvantage of the use of silicon nitride is that negative charge trapping can occur at a nitride-oxide interface in an ONO layer, either during processing of the device or during operation of the device after manufacture (e.g. due to hot electrons). In some cases, this charge trapping can sufficiently affect threshold voltages within the device that parasitic leakage paths are formed. These leakage paths may lead to sub-threshold leakage within the device sufficient to cause its malfunction. Such problems can be avoided if the trapped charges in the silicon nitride can be released. Prior approaches have attempted to accomplish this by heating the silicon nitride to relatively high temperatures near the end of processing of the device or by removing the silicon nitride which is holding the trapped charges (e.g. silicon nitride may be removed by etching in hot phosphoric acid). However, heating near the end of processing can adversely affect metallization within the device, and removal of the silicon nitride is often not practical due to a need to maintain the structural integrity of a particular device. Thus, in general, it would be preferable that the trapped charges be removed by a relatively low-temperature processing step that does not require removal of the silicon nitride.

During processing, semiconductor devices are frequently exposed to oxidizing ambients for the oxidation of, for example, silicon. Although a silicon nitride layer within a device is often conveniently exposed to these oxidizing ambients, the prior teaching has been that silicon nitride cannot be removed by oxidation because silicon nitride does not oxidize. However, if the silicon nitride could be converted to silicon oxide by oxidation, then there would no longer be the problem of silicon nitride trapping injected electrons. In many cases, oxidizing silicon nitride to form silicon oxide could more readily be integrated into the fabrication sequence for a structure than the etching away of the silicon nitride followed by the growing of a silicon oxide layer. Also, eliminating the nitride from regions sensitive to trapped charge would avoid the need for a high temperature processing step near the end of the fabrication sequence.

Also, in other cases, the oxidation of silicon nitride could provide more flexibility in adjusting the physical dimensions of a device. Often, a silicon nitride layer is used as a structural element in a device because of an advantageous material property of the nitride. For example, in a lightly-doped drain device, silicon nitride spacers are sometimes used for spacing the ion implants into the source/drain regions on the device. If the silicon nitride layer could be oxidized, then the dimensions of the initial silicon nitride layer, for example an implant spacer, could be adjusted to advantage for use in later processing steps.

Thus, there is a need for a method of oxidizing silicon nitride in semiconductor devices. In one particular case, this oxidation would reduce the quantity of charge which is trapped and thus avoid parasitic leakage paths. In other cases, this oxidation would provide more flexibility in fine-tuning the structural dimensions of a device having a silicon nitride layer.

SUMMARY OF THE INVENTION

This need is satisfied, the limitations of the prior art overcome, and other benefits realized in accordance with the principles of the present invention by a method for oxidizing a silicon nitride layer in a semiconductor device using a fluorine-containing compound. In this method a silicon nitride layer is exposed to a mixture of an oxygen reactant and a dilute amount of a fluorine-containing compound at a temperature sufficiently high to substantially cause the oxidation of the silicon nitride. The oxygen reactant is diatomic oxygen in the preferred embodiment. However, in other embodiments, the oxygen reactant could be atomic oxygen, ozone, ionized oxygen radicals such as would be obtained in a plasma, or a mixture thereof either with or without diatomic oxygen. Generally, a temperature greater than about 600° C. is sufficient to cause such oxidation, although some oxidation may occur at lower temperatures. The upper temperature range, the reaction time, and the pressure of the reaction mixture are not critical. The concentration of the fluorine-containing compound is also not critical, but is generally between about 100 to 1500 ppm by volume relative to the total mixture volume. In other cases, though, a lower or substantially higher concentration may be used. A diluent such as argon may be used as a substantial component of the oxidizing mixture.

In the preferred embodiment, $NF_3$ is a fluorine-containing compound, and a temperature greater than about 700° C. is used, preferably in the range of about 800° C. to 1000° C. The concentration of $NF_3$ in the mixture by volume is generally less than about 1500 ppm, although this is not a critical upper limit. More preferably, this concentration is between about 100 to 1000 ppm.

An important advantage of the present invention is that any trapped charges present in a silicon nitride layer are substantially released following its oxidation. In addition, the silicon nitride is converted to silicon oxide. It is known that silicon oxide traps less charge than silicon nitride. Thus, less charge will be trapped during subsequent fabrication processing steps and during device operation. Removal of these charges often eliminates undesirable parasitic leakage paths within the device.

Another advantage is that the temperature required to oxidize the silicon nitride layer is low relative to other processing steps such as growing an oxide without the addition of $NF_3$. Also, oxidation of a layer having silicon nitride affects the physical size of the layer in a predictable manner such that oxidation can be used to adjust the size of such a layer in certain cases.

In addition, in some cases exposed silicon in a different portion of a device will be oxidized substantially simultaneously with silicon nitride. In such cases, an ancillary benefit of the present invention is that silicon corners within the device are rounded during the oxidation of the silicon due to the presence of the fluorine in the oxidizing mixture. Other advantages are that the amount of oxide grown on silicon compared to the amount grown on silicon nitride can be controlled by controlling the amount of NF₃ and the oxidizing temperature.

The foregoing and other objects, features, and advantages of the invention will be apparent from the following more particular description of a preferred embodiment of the invention, as illustrated in the accompanying drawings.

BEST MODE FOR CARRYING OUT THE INVENTION

Figure 1:
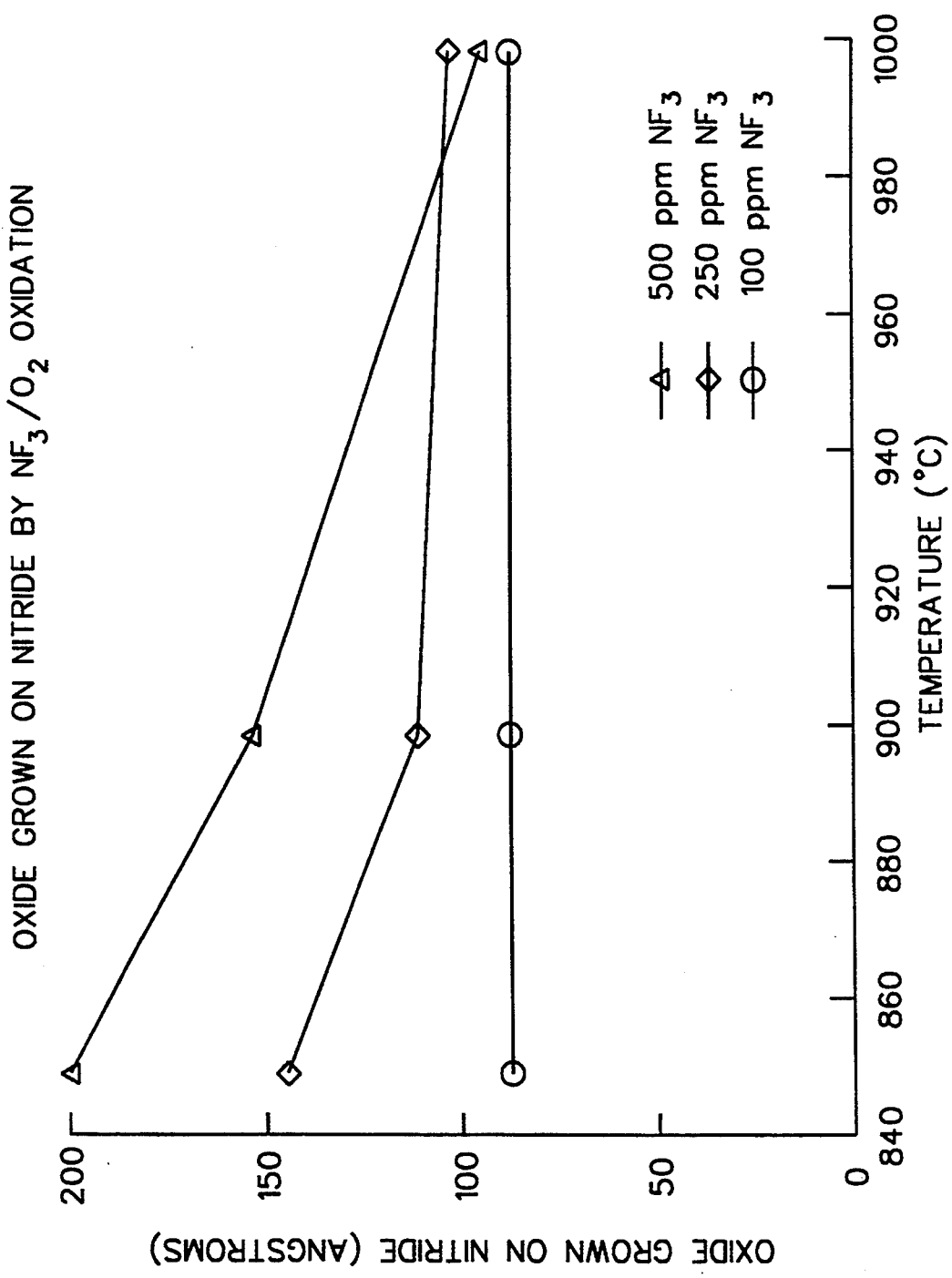
FIG. 1 is a graph illustrating the thickness of an oxide layer, formed on a silicon nitride layer by oxidation of the silicon nitride according to the present invention, versus oxidation temperature for three different concentrations of a fluorine-containing compound.

According to the present invention, a silicon nitride layer in a semiconductor device is oxidized by exposing it to an oxidizing mixture containing an oxygen reactant and a fluorine-containing compound at a temperature sufficiently high to substantially cause the oxidation of the silicon nitride. Generally, a temperature greater than about 600° C. is sufficient to cause such oxidation, although some oxidation may occur at lower temperatures. It is believed that the reaction temperature is sufficiently high if a fluorine atom in the fluorine-containing compound becomes sufficiently reactive to weaken a silicon nitride bond in the silicon nitride layer.

It is expected that a large number of compounds containing fluorine atoms having properties suitable for semiconductor processing can be used as the fluorine-containing compound according to the present invention, such as $NF_3$, $SF_6$, $SiF_4$, $CF_4$, and $C_2H_3Cl_2F$. The only other significant limitation on chemicals that can be so used is that it can be introduced in gas form into the heated region of the furnace.

The oxygen reactant is diatomic oxygen in the preferred embodiment. However, in other embodiments, the oxygen reactant could be atomic oxygen, ozone, ionized oxygen radicals such as would be obtained in a plasma, or a mixture thereof either with or without diatomic oxygen. A plasma for producing oxygen radicals may be generated using a plasma chamber having a heated chuck, such as an AME 5000.

The concentration of the fluorine-containing compound is not critical and is generally a dilute concentration that can vary over a wide range. More specifically, this concentration may generally range between about 100 to 1500 ppm by volume relative to the total mixture volume. In other cases, though, a lower or substantially higher concentration may be used.

A diluent may be used as a part of the oxidizing mixture, such as argon or nitrogen. The proportion of the diluent in the mixture is not at all critical and may be varied to a great extent. As one example, this proportion may range between about 10 to 95 percent by volume relative to the total reaction mixture. It is believed that the diluent may be beneficial in achieving mixing and carrying of the reacting gasses uniformly to all parts of the wafer.

A semiconductor wafer containing a silicon nitride layer to be oxidized according to the present invention can be heated in any of a number of ways—the type of heating used is not critical. In the preferred embodiment, the wafer is heated by rapid thermal annealing (RTA). In other approaches, the wafer may be heated in a furnace, on a wafer chuck in a plasma with the flourine-containing compound, or by local heating using laser annealing.

The time that the wafer is exposed to the oxidizing mixture is also not critical and depends upon a number of factors including the type of heating system used, the concentration of the fluorine-containing compound, and the temperature to which the wafer is heated during oxidation. Generally, when heating by RTA, oxidation times are about 1 to 10 minutes, and when heating using a furnace, oxidation times are about 20 to 40 minutes. However, times outside these ranges can be used depending upon the particular process conditions and targets. Also, the pressure of the oxidizing mixture is not critical. In the preferred embodiment, the mixture is at about atmospheric pressure, but it is expected that a wide range of pressures may be used.

The topography of a silicon nitride layer to be oxidized according to the present invention on a semiconductor wafer can vary greatly depending upon prior processing and the type device being formed. However, it is expected that the reaction of the present invention can be used with almost any topography, whether vertical or horizontal or otherwise.

Also, the thickness of the oxide film formed on a silicon nitride layer can vary widely, for example it could be up to about 300 Angstroms, and is in general limited only by the nitride available to oxidize. However, it is believed that there might be some factors which could limit the thickness of the oxide that can be grown. It is not certain, but in some cases, as the time of exposure to the oxidizing mixture according to the present invention is increased to ever longer time periods, the thickness that is oxidized may tend to reach a maximum limit. Specifically, the oxide thickness reaches a maximum even though more nitride may be consumed with longer time periods. This implies that the oxidizing mixture may be both etching the just-formed oxide as well as oxidizing nitride to form new oxide. The maximum thickness of oxide formed may be determined by an equilibrium between these two competing processes.

Often, as further described in a particular memory cell application below, it is desirable to oxidize a silicon nitride layer at the same time as a silicon layer is oxidized, say to form a gate or screen oxide. When such a simultaneous oxidation is performed, the relative oxidation rates will depend upon the concentration of flourine-containing compound in the oxidizing mixture and the reaction temperature.

In the preferred embodiment, $NF_3$ is the fluorine-containing compound, and a temperature greater than about 700° C. is used, preferably in the range of about 800° C. to 1000° C. The concentration of $NF_3$ in the mixture is generally less than about 1500 ppm by volume, although this is not a critical upper limit. More preferably, this concentration is between about 100 to 1000 ppm. Also, RTA is used for a time period of about 1 to 5 minutes to oxidize a silicon nitride layer to a depth of about 50 to 250 Angstroms. The oxidizing mixture contains diatomic oxygen with argon used as a diluent. The ratio of argon to oxygen is about 4:1. For $NF_3$ concentrations greater than about 500 ppm and temperatures below about 1000° C., it is expected that oxide thickness will increase significantly with increasing concentration of $NF_3$.

The present invention is further illustrated in the example given below. This example is provided for the purpose of description, and the details provided therein are not intended to limit the scope of the present invention.

EXAMPLE

A first semiconductor monitor wafer having a top silicon layer was exposed to various temperature and concentration conditions as shown in the table below to determine the time required to grow an oxide thickness of about 225 Angstroms thereon. These same temperature and concentration combinations were then used to oxidize a silicon nitride layer on a second semiconductor wafer. The purpose of the first wafer was to determine the oxidation time required to grow an oxide thickness of 225 Angstroms. This was done because typically a semiconductor process will require that an oxide, for example a gate oxide, be formed with a specific target thickness (in this case it was 225 Angstroms). The purpose of the second wafer was to determine the extent to which the silicon nitride layer was oxidized under conditions corresonding to that required to form a 225 Angstrom oxide during production of a semiconductor device.

The required oxidation time for a given processing combination found using the first monitor wafer was then used to oxidize the silicon nitride layer on the second wafer using an oxidizing mixture according to the present invention (oxidation of the second wafer is discussed further below). The times required to form the 225 Angstrom oxide on the first monitor wafer are shown below in the table and are opposite the processing conditions corresponding thereto.

The second wafer, having a silicon nitride layer of about 1760 Angstroms thickness thereon, was subjected to the same temperature and concentration combinations as used above for the first monitor wafer. In other words, the second wafer was exposed to an oxidizing mixture according to the present invention for the time previously determined as necessary to form a 225 Angstrom oxide (these times come from the results for the oxidation of the first monitor wafer).

In order to oxidize the silicon nitride layer on the second wafer, a dilute amount of $NF_3$ in a mixture of argon and diatomic oxygen was provided to an RTA system manufactured by AG Associates. The argon flow to the RTA system was about 8 liters/minute, the oxygen flow was about 2 liters/minute, and the $NF_3$ flow varied between about 1 to 5 sccm. Temperatures of 850°, 900°, and 1000° C. were used.

After oxidation of the silicon nitride, the thickness of the oxide thereon was determined by measurement with an elipsometer. This thickness corresponds to the portion of the silicon nitride layer which was converted to silicon oxide according to the present invention. The results are shown in the table below (this data is also illustrated in FIG. 1 which is discussed further below).

| Temperature (°C.) | $NF_3$ Flow CM | Time (sec) | Oxide thickness (Angstroms) |
| --- | --- | --- | --- |
| 1000 | 1 | 145 | 73 |
| 1000 | 2.5 | 77 | 103 |
| 1000 | 5 | 45 | 96 |
| 900 | 1 | 210 | 88 |
| 900 | 2.5 | 120 | 113 |
| 900 | 5 | 100 | 156 |
| 850 | 1 | 280 | 87 |
| 850 | 2.5 | 240 | 144 |
| 850 | 5 | 200 | 200 |

FIG. 1 is a graph illustrating the thickness of an oxide layer, formed on top of a silicon nitride layer by oxidation of the silicon nitride according to the present invention, versus oxidation temperature (°C.) for three different concentrations of a fluorine-containing compound. The data for this particular graph are for the use of $NF_3$ as the fluorine-containing compound in a mixture of argon and oxygen in a ratio of about 4:1 (argon:oxygen) using RTA with a reaction time of about 1 to 5 minutes (this data comes from the example discussed above). However, the behavior for other fluorine-containing compounds is expected to be similar.

Referring to FIG. 1, the vertical axis shows the thickness of an oxide in Angstroms formed on the surface of a silicon nitride layer having a substantially flat topography and an initial thickness of about 1760 Angstroms. The oxidation time for these data is not constant, but rather is determined by the time required to form an oxide of about 225 Angstroms on a silicon layer at the particular oxidation temperature and $NF_3$ concentration shown in the graph (this was discussed in greater detail in the example above). As the concentration of $NF_3$ increases or the temperature decreases below about 1000° C., the thickness of the oxide grown on the silicon nitride layer increases relative to the oxide grown on the silicon layer. It is expected that both of these two trends will continue into higher concentration ranges and lower temperature ranges. Also, it is believed that these two trends will be followed with the use of other fluorine-containing compounds.

The present invention is further illustrated in one specific application for the preferred embodiment given below. This application deals with the manufacture of a memory device and is provided for the purpose of further description—the details provided therein are not intended to limit the scope of the present invention. Rather, the present invention can be used with many other devices having different structures and formed by different sets of processing steps such as the oxidation of nitride spacers previously formed on the sides of a gate conductor.

Deep-Trench Memory Cell Device

Figure 2:
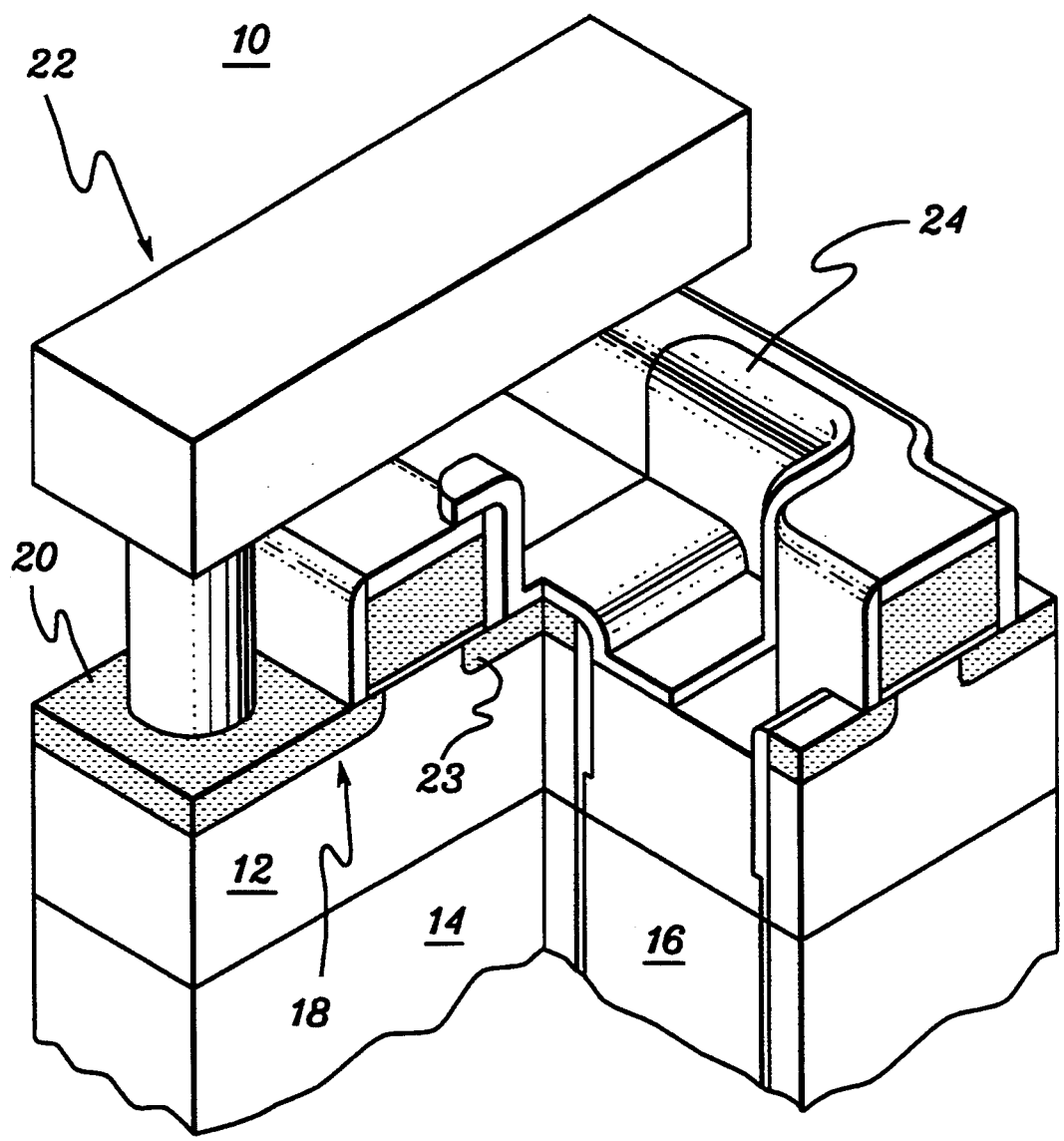
FIG. 2 is a cut-away perspective view of a deep-trench memory storage cell formed according to one particular embodiment of the present invention.

FIG. 2 is a cut-away perspective view of a deep-trench memory storage cell 10 formed using a preferred embodiment of the present invention. The details of the structure and manufacture of this device are not critical to the practice of the present invention, but can be found in commonly-assigned U.S. Pat. No. 4,801,988, issued Jan. 31, 1989, which is hereby incorporated by reference. All information believed necessary for the practice of the present invention is presented below.

Referring to FIG. 2, memory cell 10 is formed in an n-well 12 disposed in a silicon substrate 14 doped with a p-type dopant (i.e. a p+ substrate). A deep trench 16, used for storing charge corresponding to the memory contents of cell 10, is etched into substrate 14 through n-well 12. A p-channel transfer device 18 has a source/drain region 20 connected to a bit line 22 and another source/drain region 23 connected to trench 16 by a polysilicon surface strap 24.

Figure 3:
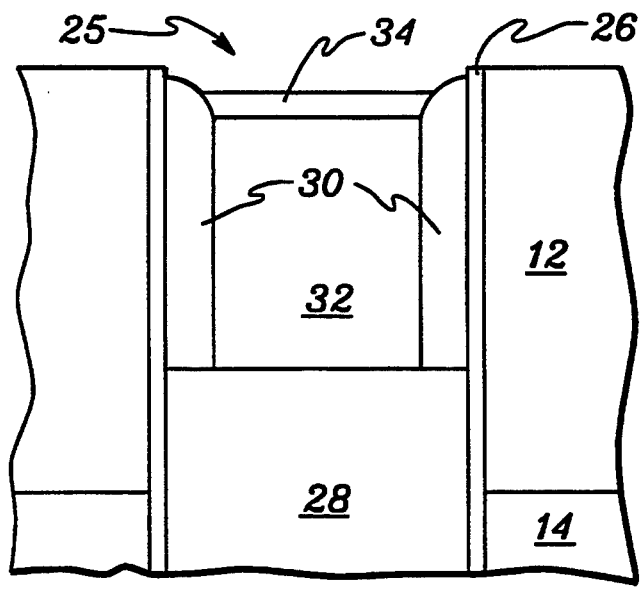
FIG. 3 is a cross-sectional view showing greater detail of the trench of FIG. 2.

FIG. 3 is a cross-sectional view showing greater detail of the top portion of trench 16 of FIG. 2. The structure is illustrated just prior to gate oxide growth and gate polysilicon deposition. Trench 16 has a top end 25 which is connected to surface strap 24 through an opening therein (not shown). During the formation of trench 16, after it is etched into substrate 14, an ONO insulation layer 26 is formed on its interior surface. ONO layer 26 is a composite layer formed by first oxidizing the interior surface of trench 16 to form a 40 Angstrom silicon oxide layer, then forming a 90 Angstrom silicon nitride layer, and finally subjecting this nitride layer to a 1000° C. steam oxidation for 16 minutes to convert the top 20 Angstroms of nitride to 30 Angstroms of oxide (these layers are not shown in FIG. 3, but are shown later in FIG. 4). Next, trench 16 is filled with polysilicon and etched back partially to form a first polysilicon fill layer 28. An oxide layer is deposited overlying fill layer 28 and then etched back to form oxide collars 30.

After oxide collars 30 are formed, the top end of trench 16 is filled with polysilicon and then etched back about 2000 Angstroms to form a second polysilicon fill layer 32. Finally, a cap oxide layer 34 is formed on fill layer 32. It is planarized by polishing to a nitride layer (not shown) which has been formed over the n-well for this planarization. After polishing, the nitride is stripped using hot phosphoric acid. FIG. 3 shows the structure after this stripping.

Figures 4, 5:
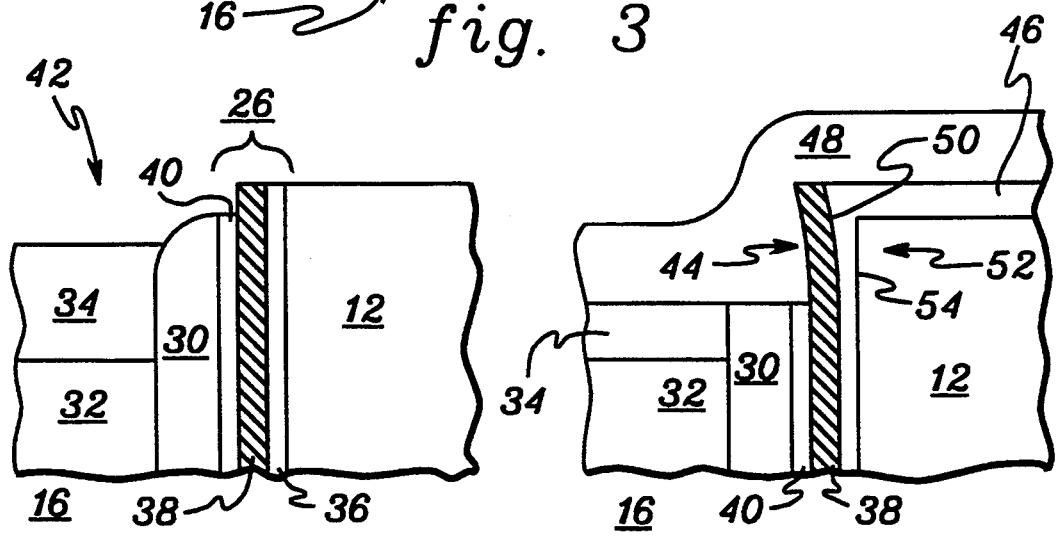
FIG. 4 is a cross-sectional view illustrating further detail of the top right-hand portion of the trench of FIG. 3.
FIG. 5 is a cross-sectional view of the trench of FIG. 4 where a gate oxide and polysilicon layer have been formed without oxidation of a silicon nitride layer, in contrast to the present invention.

FIG. 4 is a cross-sectional view illustrating further detail of the top right-hand portion of trench 16 of FIG. 3. As described above, ONO insulation layer 26 is a composite layer having a first silicon oxide layer 36, a silicon nitride layer 38, and a second oxide layer 40. After planarization of the oxide cap and etching of the nitride polish stop, as described above, a thin oxide (not shown) which was under the nitride stop is etched using a dilute HF acid bath. This also removes a portion 42 of cap oxide layer 34, oxide collars 30, and oxide layer 40.

FIG. 5 is a cross-sectional view of trench 16 of FIG. 4 where a gate oxide 46 and a polysilicon gate layer 48 have been formed without oxidation of silicon nitride, in contrast to the present invention. In other words, FIG. 5 illustrates the resulting topography for the trench where oxidation of the silicon nitride layer by the present invention is not used. Following dipping into a dilute HF acid bath as described above, a screen oxide (not shown) is grown for performing threshold tailoring ion implants and then stripped using dilute HF. As a result of this stripping, a portion 44 of silicon nitride layer 38 is exposed (i.e. uncovered by silicon oxide) as cap oxide layer 34, oxide collar 30, and oxide layer 40 are further etched back by the HF acid bath. Portion 44 has an extent of about 200 Angstroms. Next, gate oxide 46 is grown on n-well 12, and polysilicon gate layer 48 is deposited overlying gate oxide 46 and trench 16. Oxide layer 36 from FIG. 4 is shown as part of gate oxide layer 46.

It should be noted that in the absence of the present invention silicon nitride layer 38 is not oxidized during the growth of either the screen or gate oxide. Also, polysilicon gate layer 48 extends downward into the top end of the trench such that portion 44 of silicon nitride layer 38 is disposed substantially between polysilicon layer 48 and n-well 12.

Because charging occurs during processing of the memory cell device, for example during plasma processing, electrons will typically be injected onto and trapped at an interface 50 of silicon nitride layer 38. This trapped negative charge tends to turn on a parasitic p-channel device 52 which has been formed by virtue of the topography resulting from the processing described above. More specifically, polysilicon layer 48 forms the gate of parasitic device 52. The charge at interface 50 aids the inversion of the n-well material near interface 54 resulting in conduction from the source to the drain of transfer device 18. Because of the trapped negative charge at interface 50, the threshold voltage of parasitic device 52 is sufficiently lowered such that a leakage path often occurs during operation of the memory cell. Charge trapping at interface 50 may also occur during operation of the memory cell after manufacture which leads to a reliability problem. As described below, the silicon nitride layer disposed between polysilicon layer 48 and n-well 12 may be removed by oxidation according to the present invention so that parasitic device 52 is substantially eliminated.

Figure 6:
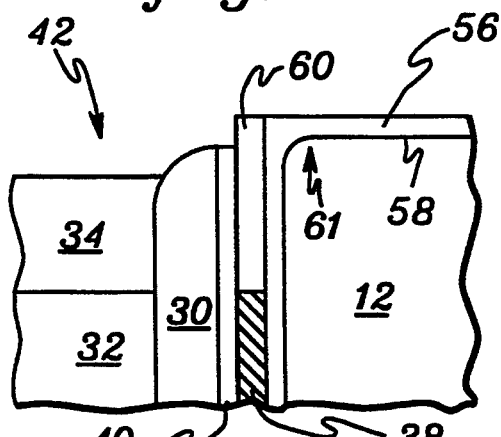
FIG. 6 is a cross-sectional view of the trench of FIG. 4 where a screen oxide has been formed with oxidation of a silicon nitride layer according to the present invention.

FIG. 6 is a cross-sectional view of trench 16 of FIG. 4 where a screen oxide 56 has been formed by oxidation of silicon nitride according to the present invention. FIG. 6 continues with the processing shown in FIG. 4 and makes use of the present invention to oxidize the top portion of the silicon nitride layer. As described above, following the dilute HF acid bath which removes portion 42 of cap oxide layer 34, oxide collars 30, and oxide layers 36 (not shown) and 40, screen (also known as sacrificial) oxide layer 56 is grown on n-well 12 for use during ion implantation and has a thickness of about 225 Angstroms. Oxide layer 36 from FIG. 4 is shown as part of screen oxide layer 56.

According to the present invention, during the oxidation of the silicon at the top surface 58 of n-well 12, the top portion of silicon nitride layer 38 is oxidized to form a silicon oxide layer 60. Both the silicon and silicon nitride are oxidized in the same processing step using a mixture of oxygen and a fluorine-containing compound, preferably NF$_3$, at processing conditions as described in detail above. An advantage of the present invention is that silicon corner 61 is rounded relative to what its shape would be in the absence of oxidation with a fluorine-containing compound.

Figure 7:
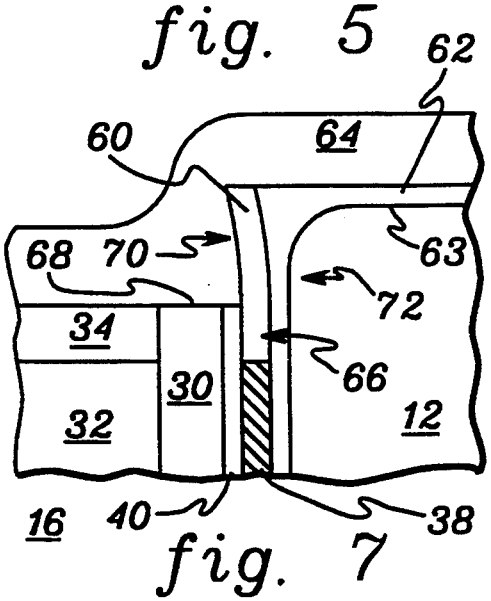
FIG. 7 is a cross-sectional view of the trench of FIG. 6 after a gate oxide and polysilicon layer have been formed thereon.

FIG. 7 is a cross-sectional view of trench 16 of FIG. 6 after a gate oxide 62 and a polysilicon gate layer 64 have been formed thereon. After ion implantation above, screen oxide 56 is stripped off. Gate oxide 62 is grown on the top surface 63 of n-well 12. Gate oxide 62 may be grown using an oxidizing mixture according to the present invention which will further oxidize a portion of silicon nitride layer 38. In the preferred approach, silicon nitride layer 38 is oxidized only during the growth of the screen oxide and not during the growth of the gate oxide. However, in other cases, nitride layer 38 could be oxidized only during the growth of the gate oxide, or oxidized in two steps, first during the growth of the screen oxide and second during growth of the gate oxide as indicated above.

After silicon nitride layer 38 is oxidized according to the present invention, a lower portion 66 of oxide layer 60 will typically extend below the top surface 68 of cap oxide layer 34, oxide collar 30, and oxide layer 40. This result occurs because the oxidizing mixture including the fluorine-containing compound partially diffuses into the top oxide layers and oxidizes portion 66 of oxide layer 60. In a typical device, for example, lower portion 66 may extend about 300 Angstroms below top surface 68. This result is significant because the removal of the screen oxide also removes about 200 Angstroms of the cap oxide. It is desirable to keep the gate polysilicon from over-lapping the un-oxidized nitride layer 38. Following the oxidation of the silicon nitride, substantially all the trapped charges are released into the surrounding oxide, and when the wafer is at a high temperature, are conducted to the substrate. Also, charging from later processing or other operations is not substantially trapped by oxide layer 60.

After formation of gate oxide 62, polysilicon gate layer 64 is deposited thereover. It should be noted that, although polysilicon layer 64 still wraps around a top portion 70 of oxide layer 60 (which used to be silicon nitride layer 38), no parasitic leakage path is formed because oxide layer 60 does not substantially trap charges that reduce the threshold voltage of parasitic p-channel device 72 (which would occur if silicon nitride were not oxidized according to the present invention).

Following deposition of polysilicon layer 64, processing continues in a conventional manner. This includes etching the polysilicon layer, implanting the junctions for devices in the memory cell, forming the surface strap, and forming passivation.

Although the present invention has been described in detail above, it is not intended to be limited to the specific form set forth herein, but, on the contrary, it is intended to cover such alternatives and equivalents as can reasonably be included within the spirit and scope of the invention as defined by the appended claims.

For example, in other embodiments according to the present invention, an oxidizing mixture according to the present invention can be used to oxidize the nitride layer in a trench cell after the first polysilicon fill layer is formed, but before formation of the oxide collar. This requires the use of a wet or dry oxide etch to remove from the exposed surface of the first polysilicon fill layer.

Also, in another application of the present invention, the oxidation of silicon nitride can provide more flexibility in adjusting the physical dimensions of a device. Often, a silicon nitride layer is used as a structural element in a device because of an advantageous material property of the nitride. For example, in a lightly-doped drain device, silicon nitride spacers are sometimes used for spacing the ion implants into the source/drain regions on the device. When the silicon nitride layer is oxidized according to the present invention, the dimensions of the initial silicon nitride layer, for example an implant spacer, are increased. This increase in size can be varied to adjust the spacing of the implants for the lightly-doped drain device.

Also, the present invention is useful where it is desired to remove silicon nitride in an isotropic manner. For example, "Kooi" type defects typically occur when forming semi-recessed oxide (SROX) isolation due to nitridization of silicon. However, these defects can be avoided in certain cases by forming the SROX using the oxidizing mixture of the present invention.

We claim:

1. A method for manufacturing a semiconductor device, comprising the steps of:
   providing a semiconductor substrate;
   etching a trench into said substrate, said trench having an interior surface and a top end and extending into the body of said substrate;
   forming an insulation layer on said interior surface of said trench;
   said insulation layer comprising at least in part a silicon nitride layer; and
   oxidizing said silicon nitride using a mixture comprising an oxygen reactant and a dilute amount of $NF_3$ at a temperature greater than about 700° C. and below 1000° C.; the concentration of $NF_3$ being between about 100 to 1000 ppm.

2. The method of claim 1 further comprising the steps of:
   forming an oxide collar overlying a portion of said insulation layer; and
   forming a cap oxide having a top surface substantially near the top end of said trench.

3. The method of claim 2 wherein said insulation layer is an ONO layer.

4. The method of claim 3 further comprising the step of substantially filling said trench with polysilicon.

5. The method of claim 4 wherein said silicon nitride is oxidized in a region substantially near said top end of said trench.

6. The method of claim 5 wherein said silicon nitride is oxidized below said top surface of said cap oxide to a depth sufficient to substantially eliminate parasitic leakage current.

7. The method of claim 5 wherein said semiconductor device is a deep-trench memory cell.

8. The method of claim 1 wherein said oxygen reactant is selected from the group consisting of diatomic oxygen, atomic oxygen, ozone, and an ionized oxygen radical.

9. The method of claim 8 wherein said mixture comprises a diluent having a proportion between about 10 to 95 percent by volume relative to the total volume of said mixture.

10. A method for manufacturing a semiconductor device having a silicon nitride layer, comprising oxidizing said silicon nitride layer using a mixture comprising an oxygen reactant and a dilute amount of $NF_3$ at a temperature between about 700° C. to 1000° C.; wherein said oxygen reactant is selected from the group consisting of diatomic oxygen, atomic oxygen, ozone and ionized oxygen radical and wherein the proportion of $NF_3$ is between about 100 to 1000 ppm.

11. The method of claim 10 wherein said mixture further comprises a diluent.

12. The method of claim 11 wherein said diluent is argon.

13. The method of claim 12 wherein said step of oxidizing is performed substantially at atmospheric pressure.

14. The method of claim 13 further comprising the step of heating said silicon nitride layer using rapid thermal annealing.

15. A method for manufacturing a semiconductor device, comprising:
   providing a silicon nitride layer; and
   oxidizing said silicon nitride layer using a gas mixture comprising an oxygen reactant and $NF_3$ at a temperature between about 700° C. to 1000° C., the proportion by volume of $NF_3$ in said mixture being between about 100 to 1000 ppm relative to the total volume of said mixture.

16. The method of claim 15 wherein said oxygen reactant is selected from the group consisting of diatomic oxygen, atomic oxygen, ozone, and an ionized oxygen radical.

17. The method of claim 16 wherein said mixture further comprises a diluent.

* * * * *

UNITED STATES PATENT AND TRADEMARK OFFICE
CERTIFICATE OF CORRECTION

PATENT NO. : 5,434,109
DATED      : Jul. 18, 1995
INVENTOR(S) : Geissler et al.

It is certified that error appears in the above-indentified patent and that said Letters Patent is hereby corrected as shown below:

Column 6, line 15, delete --CM-- and insert therefor, "(sccm)".

Column 7, line 1, between Deep-Trench Memory and Cell Device, delete --.--.

Signed and Sealed this

Ninth Day of January, 1996

Attest:

BRUCE LEHMAN

Attesting Officer

Commissioner of Patents and Trademarks